US006639225B2

(12) United States Patent
Kirschstein et al.

(10) Patent No.: US 6,639,225 B2
(45) Date of Patent: Oct. 28, 2003

(54) SIX-AXIS POSITIONING SYSTEM HAVING A ZERO-MAGNETIC-FIELD SPACE

(75) Inventors: Ulf-Carsten Kirschstein, Jenapriessnitz (DE); Erik Beckert, Arnstadt (DE); Andrew Hoffmann, Ilmenau (DE); Christoph Schaeffel, Ilmenau (DE); Eugen Saffert, Ilmenau (DE); Johannes Zentner, Ilmenau (DE); Torsten Gramsch, Ilmenau (DE)

(73) Assignee: Leica Microsystems Lithography GmbH, Jena (DE)

( * ) Notice: Subject to any disclaimer, the term of this patent is extended or adjusted under 35 U.S.C. 154(b) by 208 days.

(21) Appl. No.: 09/951,762

(22) Filed: Sep. 14, 2001

(65) Prior Publication Data

US 2002/0079461 A1 Jun. 27, 2002

(30) Foreign Application Priority Data

Sep. 15, 2000 (DE) ......................................... 100 46 144

(51) Int. Cl.$^7$ ................................................. G21K 5/10
(52) U.S. Cl. ............................. 250/442.11; 250/440.11; 250/491.1; 250/492.2; 250/398
(58) Field of Search ....................... 250/442.11, 440.11, 250/491.1, 492.2, 398

(56) References Cited

U.S. PATENT DOCUMENTS

| | | | |
|---|---|---|---|
| 6,281,654 B1 * | 8/2001 | Lee | 318/649 |
| 6,449,030 B1 * | 9/2002 | Kwan | 355/72 |
| 2001/0050341 A1 * | 12/2001 | Kwan et al. | 250/491.1 |

* cited by examiner

Primary Examiner—Nikita Wells
(74) Attorney, Agent, or Firm—Foley & Lardner

(57) ABSTRACT

The invention refers to an arrangement for positioning substrates, in particular for positioning wafers, within a device that is provided for exposure of the substrates and/or for measurement on the substrates by means of radiation under high-vacuum conditions. The following are provided according to the present invention: a retention system (4), displaceable on a linear guidance system (3), for receiving the substrate, the guidance direction of the linear guidance system (3) being oriented parallel or substantially parallel to the Y coordinate of an X, Y, Z spatial coordinate system; drives for limited modification of the inclination of the guidance direction relative to the Y coordinate; drives for limited rotation of the linear guidance system (3), including the retention system (4), about the guidance direction; and drives for parallel displacement of the linear guidance system (3), including the retention system (4), in the direction of the X coordinate, the Y coordinate, and/or the Z coordinate.

12 Claims, 4 Drawing Sheets

SIX-AXIS POSITIONING SYSTEM HAVING A ZERO-MAGNETIC-FIELD SPACE

CROSS REFERENCE TO RELATED APPLICATIONS

This invention claims priority of the German patent application 100 46 144.1 which is incorporated by reference herein.

FIELD OF THE INVENTION

The invention refers to an arrangement for positioning substrates, in particular for positioning wafers, within a device that is provided for exposure of the substrates and/or for measurement on the substrates by means of radiation under high-vacuum conditions.

BACKGROUND OF THE INVENTION

Arrangements of this kind are used principally in the semiconductor industry in chip production. In this context, with new lithography methods the need more and more often arises for novel and complex drive systems for particular utilization conditions such as high vacuum and environments with minimal magnetic or electrostatic interference fields. Positioning stages are used on which the substrates, in particular wafers, are placed. Displacement of the stages causes the substrates to be brought into the appropriate position for exposure or measurement.

As feature sizes in semiconductor technology become increasingly small, the physical limits of conventional photo-optical lithography for the exposure of wafers are reached. The industry is therefore putting more and more effort into other methods such as, for example, ion beam lithography, electron beam lithography, or EUV (extreme ultraviolet) lithography. These methods usually place severe demands on the equipment, either because they are used under vacuum conditions or because of their sensitivity to electrostatic or magnetic interference fields. These demands apply in particular to a wafer stage for positioning the wafer during the ion beam lithography process.

The method for wafer exposure by means of an ion beam requires a wafer stage for positioning the wafer with respect to the exposing beam. The exposure process itself necessitates an ion source as well as a column of electrostatic lenses to focus the beam. Special wafer positioning requirements result therefrom. The sensitivity of the ion beam to electrostatic and magnetic interference requires the elimination of potential interference sources in the immediate vicinity of the exposure location, and careful shielding with respect to such sources (e.g. the wafer stage drives) elsewhere in the vicinity.

In addition, nonoptical exposure methods usually operate under high-vacuum conditions (in this case $10^{-6}$ mbar). This results in problems with outgassing of materials and thermal stresses on power components. The drives that are used must therefore be selected with optimized power dissipation in mind, and if possible must be equipped with a cooling system. Materials that are not vacuum-compatible cannot be used. Friction and wear must be minimized or even eliminated.

The wafer stage must moreover make possible the exposure of wafers of different sizes, in particular 300 mm wafers, and for that purpose must possess a displacement range of at least 310×310 mm$^2$. To compensate for wedge errors and focal position deviations on the wafer, wafer movements must be implemented in as many spatial degrees of freedom as possible. To assist the electronic beam tracking system (which operates in the nanometer range), an achievable positioning smoothness and accuracy in the sub-micrometer or microradian range is desirable. The measurement of optical reference marks on the wafer surface, which is required for coupling of the ion beam with the wafer, necessitates at least partially uniform displacement rates with a deviation of less than 2%. Not least, the wafer stage must make possible a high throughput of exposed wafers per unit time, and therefore must possess good dynamic properties.

The existing art does not offer any comparable systems that are designed for such different properties as operation in high vacuum, vertical working plane of the positioning system, compensation for the weight of the rotor arrangement using magnetic forces, and shielding of resulting magnetic fields down to a residual value in the nanotesla range, and that combine these features in one unit.

Conventional positioning systems for high precision usually meet the stated requirements for accuracy and dynamics by the fact that the moving elements are guided aerostatically. This does not, however, allow these systems to be used in vacuum.

SUMMARY OF THE INVENTION

Proceeding from this existing art, the object of the invention is that of further developing the positioning systems in such a way that greater positioning accuracy is achieved as a prerequisite for exact exposure and measurement of increasingly fine patterns even under high vacuum.

According to the present invention, what is provided for this purpose is an arrangement for positioning substrates of the kind described initially which comprises: a retention system, displaceable on a linear guidance system, for receiving the substrate, the guidance direction of the linear guidance system being oriented parallel or substantially parallel to the Y coordinate of an X, Y, Z spatial coordinate system; drives for modification of the inclination of the guidance direction relative to the Y coordinate; drives for rotation of the linear guidance system, including the retention system, about the guidance direction; and drives for parallel displacement of the linear guidance system, including the retention system, in the direction of the X coordinate, the Y coordinate, and/or the Z coordinate.

The invention is based on a novel six-axis positioning system having a zero-magnetic-field space, suitable for use in high vacuum for flat substrates, in particular wafers, in conjunction with exposure systems and measuring instruments using charged particles for irradiation, in which stringent requirements are applied for the elimination of interfering magnetic fields in the particle beam region. This positioning system is characterized by high precision and dynamics in all motion axes, and by great rigidity.

In a particularly preferred embodiment of the invention, two drive units are provided, each of which has a stator and a rotor with a modifiable air gap between them, the rotors being displaceable in the X direction and each rotor being joined to the opposite end of the linear guidance system for the retention system. A synchronous displacement of the two rotors causes a parallel displacement in the X direction, whereas an asynchronous displacement of the two rotors causes a change in inclination in the X direction (in other words, a rotation about the Z direction); and a synchronous change in the air gaps in the two linear motors causes a parallel displacement in the Z direction or a rotation about the Y direction, whereas an asynchronous change in the air gaps in the two linear motors causes a change in inclination in the Z direction (in other words, a rotation about the X direction).

It is thereby possible selectably to achieve parallel displacements in the direction of the X and/or Z coordinates, or rotations about the X, Y, and/or Z directions.

Each stator preferably contains, for use in vacuum, the drive coils of a linear motor acting in the X direction, and ferromagnetic guideways in the Z and Y directions. The rotor then carries the permanent magnet circuit of the linear motor, and electromagnetic actuators in which the ferromagnetic guideway of the stator is part of the respective magnetic circuit; as a result, the requisite bearing and drive forces between the rotor and the guideways of the stator are generated in noncontact fashion.

To control the air gap in the Z direction, each rotor is equipped with four such electromagnetic actuators that lie opposite each other in pairs at the respective stator; for each unit, the two actuator pairs have a spacing from one another measured in the X direction, and are activated so as to generate either an equilibrium of forces in a desired position, or requisite acceleration forces for positional changes. A noncontact magnetic guidance system in the Z direction, with an adjustable air gap, is thereby implemented.

At least a fifth such electromagnetic actuator is provided in order to generate the bearing force acting in the Y direction and as a drive for parallel displacement of the linear guidance system in the Y direction, activation of this actuator resulting in an influence on the air gap measured in the Y direction. A noncontact magnetic guidance system is thus implemented in the Y direction as well.

With this arrangement, it is advantageously possible to activate or control and reliably govern magnetic guidance systems or drives for six axes synchronously and in real time, thereby achieving changes in the position of the wafer surface in all six degrees of freedom, namely by displacements of the wafer in the X, Y, Z coordinate directions and by rotations about each of these coordinate directions, independently of one another in each case.

The retention system and the guideway of the linear guidance system are preferably made of nonmagnetic material. A stepping motor is present whose rotational motion is converted, via a Bowden cable system, into the linear motion of the retention system along the linear guidance system; and devices for clamping the retention system in a defined displacement position on the linear guidance system, which for example can be configured in the form of piezoactuators, are provided.

Advantageously, the retention system should substantially comprise a wafer chuck made of Zerodur for placement and electrostatic retention of the substrates to be exposed or measured, and a frame fabricated of titanium for mounting the wafer chuck. The linear guidance system should advantageously be fabricated of ceramic, the frame being coupled to the linear guidance system via lubrication-free ceramic ball bearings.

Interferometer arrangements that operate independently of one another are provided, for example, for measuring the respectively achieved displacement positions of the retention system and/or of the rotors in the X and Y directions.

In such a case mirror surfaces, which serve for measurement of the respectively achieved displacement positions using the interferometer arrangements that are provided, are machined onto the retention system, preferably onto the wafer chuck.

Three capacitative sensors that measure the distance of the substrate surface from a stipulated reference plane can be provided for measurement of the position of the substrate in the Z direction.

Also present in a particularly preferred embodiment of the invention are means for magnetic shielding of the regions in which the radiation used for exposure and/or measurement travels. This shielding protects said radiation from the influence of interfering magnetic fields, in particular from the magnetic fields of the drives for inclination change, rotation, and/or parallel displacement.

The shielding can be configured in the form of multi-layer shielding walls, the shielding walls, which are located between subassemblies that are displaceable with respect to one another, being offset laterally from one another so that meander-shaped magnetic seals are created.

The frame-mounted subassemblies of the linear motors, in particular coils, should be cooled. Provision can furthermore be made for equipping the movable subassemblies of the linear motors, in particular the rotors, with a thermally radiating surface coating.

BRIEF DESCRIPTION OF THE DRAWINGS

The invention will be explained in more detail below with reference to an exemplary embodiment. In the accompanying drawings.

DETAILED DESCRIPTION OF THE INVENTION

Figure 1:
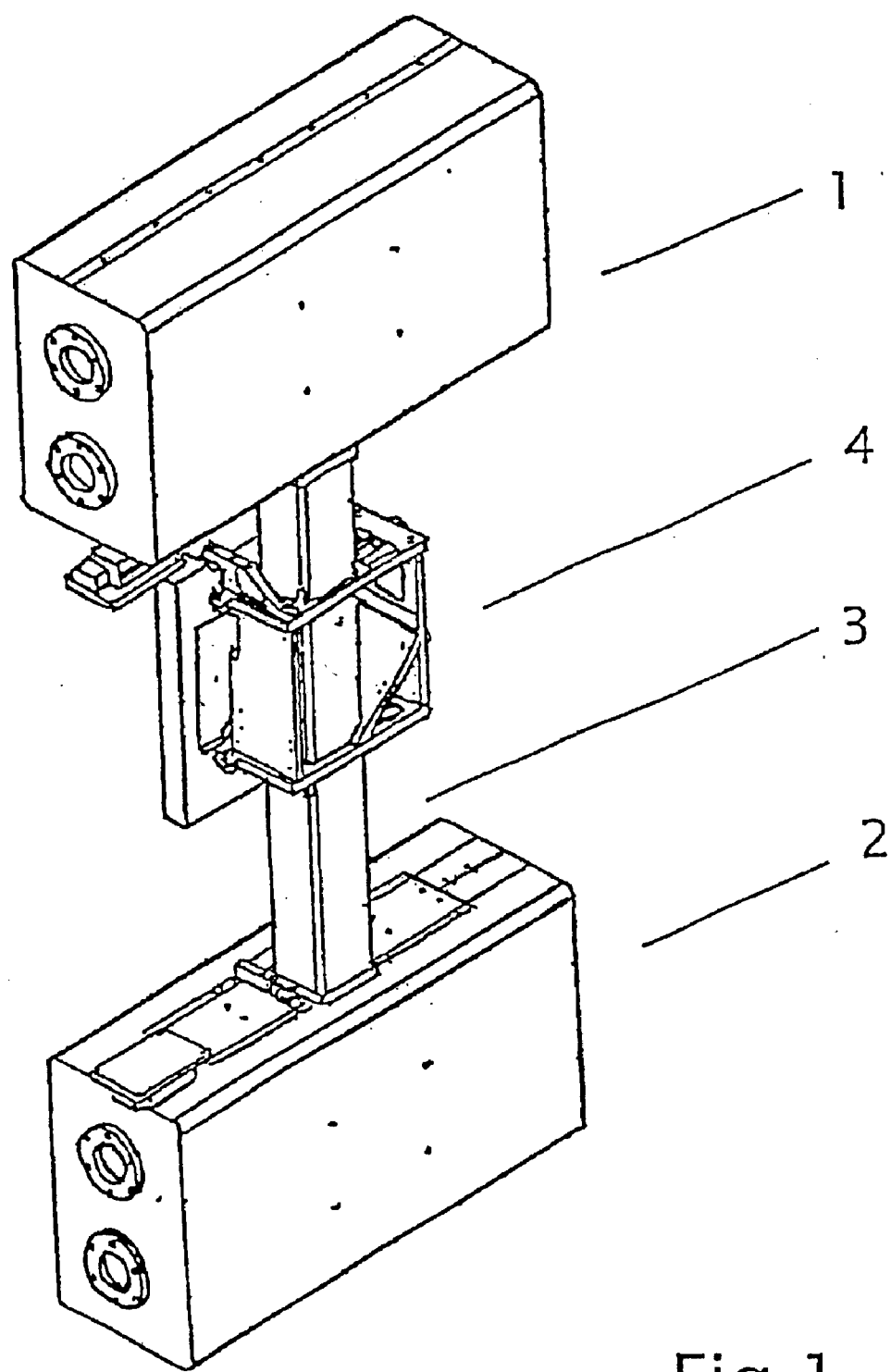
FIG. 1 shows the arrangement according to the present invention in an external overall view depicting the principle.

It is evident from FIG. 1 that two drive units 1, 2 are connected by a ceramic profile that is part of a linear guidance system 3. The ceramic profile of linear guidance system 3 carries a nonmagnetic retention system 4 for a substrate, in this case e.g. for a wafer. Retention system 4 is arranged displaceably on linear guidance system 3.

Linear guidance system 3, inclusive of retention system 4, is to be displaced by means of the two drive units 1, 2 in a direction parallel to the substrate surface, and guided and driven in all directions in zero-backlash fashion with little elastic resilience, as will be shown below.

What is achieved according to the present invention is that retention system 4, by way of the two drive units 1, 2 that are spaced apart from one another by the length of linear guidance system 3 and are also magnetically shielded separately from one another, can be positioned in all six spatial degrees of freedom with high precision and dynamics in the vacuum chamber of a device that serves for exposure of the wafer and/or for measurement on the wafer by means of radiation.

In the installed state, drive units 1, 2 can of course assume any position in the chamber, although a horizontal orientation is preferred. The direction of motion of retaining system 4 is in that case oriented vertically, i.e. in the direction of gravity, along linear guidance system 3.

The ceramic profile of linear guidance system 3 serves as a guide element and can simultaneously receive drive elements that are necessary for triggering the displacement motion of retention system 4 (not depicted in the drawing).

Figure 2:
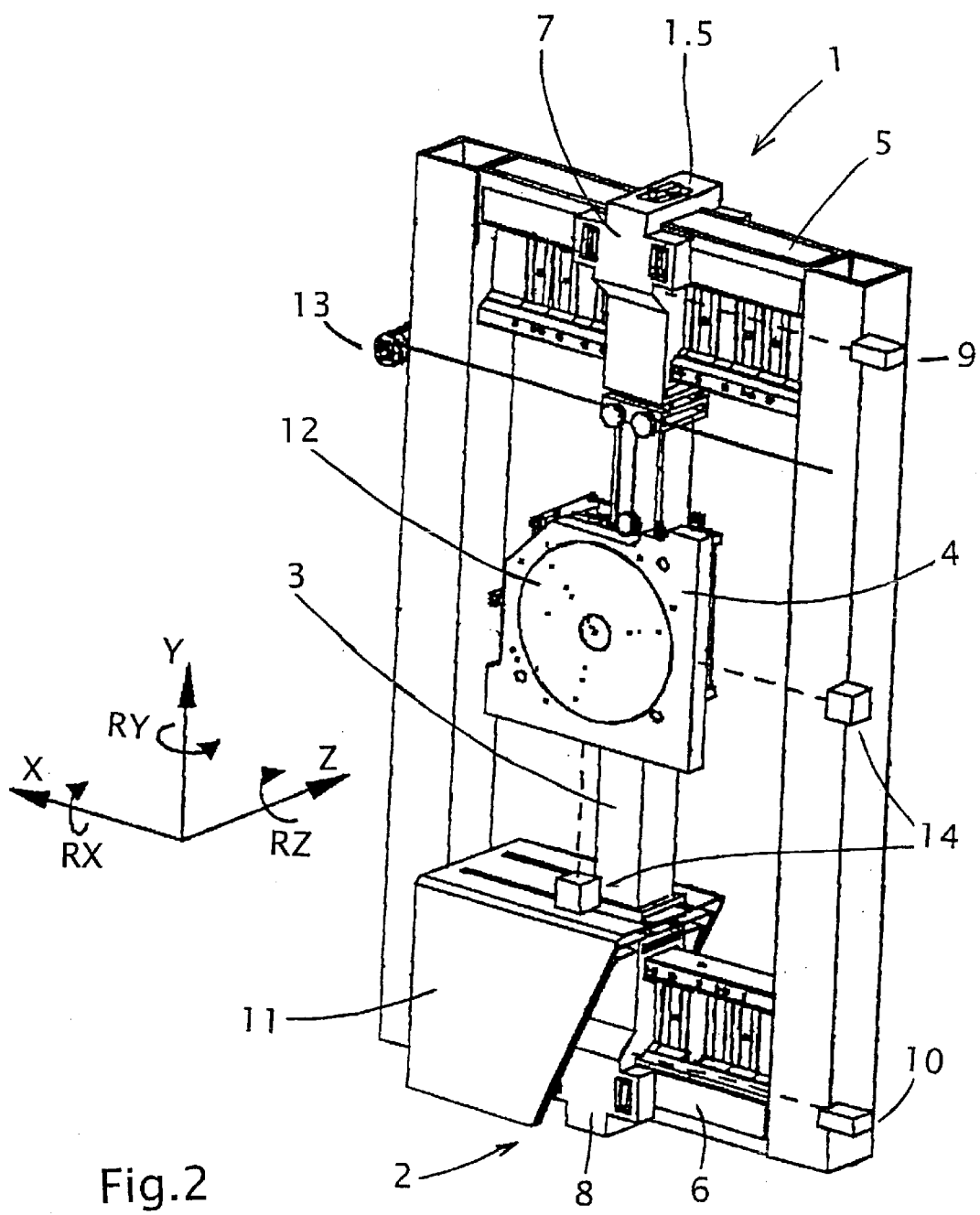
FIG. 2 shows the overall view depicting the linear guidance system, the retention system, and the arrangement of the drives.

FIG. 2 indicates that the two drive units 1, 2 are embodied as linear motors, the air gap between stator 5, 6 and rotor 7, 8 being modifiable in each case. Located on rotors 7, 8 are magnetic bridges having permanent magnets, to compensate for the weight of the guided unit. They are configured in such a way that the electromagnets integrated into rotors 7, 8 must generate comparatively small forces for positional stabilization, and thermal loads are thus reduced.

The two drive units 1, 2 are magnetically guided in each of four degrees of freedom. In the remaining two degrees of freedom, guidance is accomplished by the linear motors, in which no mechanical contact points exist between stator 5, 6 and rotor 7, 8. The highly dynamic fine adjustment motion is implemented within the range of motion by controlling the air gap of the magnetic guides in degrees of freedom Y, Z, RX, and RY, and by positioning the linear motors in degrees of freedom X, RZ.

Measurement of the position of rotors 7, 8 is accomplished by means of two plane mirror interferometers 9, 10 operating independently of one another. Capacitative sensors (not depicted in the drawing), which are used together with plane mirror interferometers 9, 10 to measure the position of retention system 4, are additionally provided.

Also provided for each drive unit are magnetic shielding walls 11 to protect the particle beam region from interfering magnetic fields; these are each embodied in multiple layers, the slots necessary for motion transfer being offset laterally from one another in the individual layers, thus creating a meander-shaped magnetic seal which makes possible a rigid connection between rotors 7, 8 and the zero-magnetic-field retention system 4. For the sake of clarity, in FIG. 2 magnetic shielding walls 11 are shown only on drive unit 2.

In order to eliminate disruptive thermal expansion of the subassemblies of drive units 1, 2, and in particular also of the subassemblies of retention system 4, the frame-mounted coils of the linear motors, with their mount, are water-cooled. This mount and also the surfaces of rotors 7, 8 are moreover equipped with a suitable surface coating so that effective radiative cooling is implemented in order to dissipate the heat of the magnetic bearings (not depicted in the drawing).

The linear motors and magnetic bearings are advantageously arranged outside the particle beam region, i.e. outside the region in which the radiation used for exposure and/or measurement travels, and are not mounted directly on retention system 4 for the substrate. They are arranged around this particle beam region, a symmetrical arrangement being preferred.

It is also evident from FIG. 2 that retention system 4 is equipped with a wafer chuck 12 for receiving the wafer with the wafer surface oriented vertically. A stepping motor drive 13 allows (coarse) positioning over an adjustment range of approximately 320 mm in the vertical Y axis.

Wafer chuck 12, on which the wafer is retained electrostatically, is fabricated with high precision from temperature-stable Zerodur. Machined laterally onto wafer chuck 12 are mirror surfaces that are used for ascertaining and monitoring the chuck position with a six-beam laser interferometer arrangement 14 (resolution: 0.6 nm) in all spatial degrees of freedom except the Z coordinate. The position of the wafer with respect to the Z coordinate is ascertained directly on the wafer surface with the aid of three highly accurate capacitative sensors (not depicted). The measured signals thereby obtained are also referred to hereinafter as "global" signals, since they represent the immediate position of the wafer to be exposed.

Wafer chuck 12 is coupled in stress-free fashion onto a frame made of titanium profiles which is guided vertically with the aid of lubrication-free ceramic ball bearings along the ceramic profile of linear guidance system 3. The vertical motion for retention system 4 with wafer chuck 12 is coupled in, as already explained, via a Bowden cable driven by a fast stepping motor 13.

With the aid of piezoactuators (not depicted), the frame can be clamped in any desired vertical Y coordinate in a range of ±160 mm with an accuracy of approx. ±10 $\mu$m. This yields repeatabilities in the range of a few $\mu$m/$\mu$rad in all other coordinates. Once the desired vertical position of the wafer is reached, the wire of the Bowden cable is detensioned to minimize its influence on drive units 1, 2.

The electrodynamic direct drives or linear motors provided in drive units 1, 2 are magnetically guided and triply shielded (shielding walls 11). They make possible a highly accurate horizontal X motion of ±160 mm, which is measured with the aid of the two plane mirror interferometers 9, 10, with a resolution of 5 nm, on the upper and lower linear motors. A controlled asynchronous movement of the two linear motors results in the RZ rotation.

Figure 3:
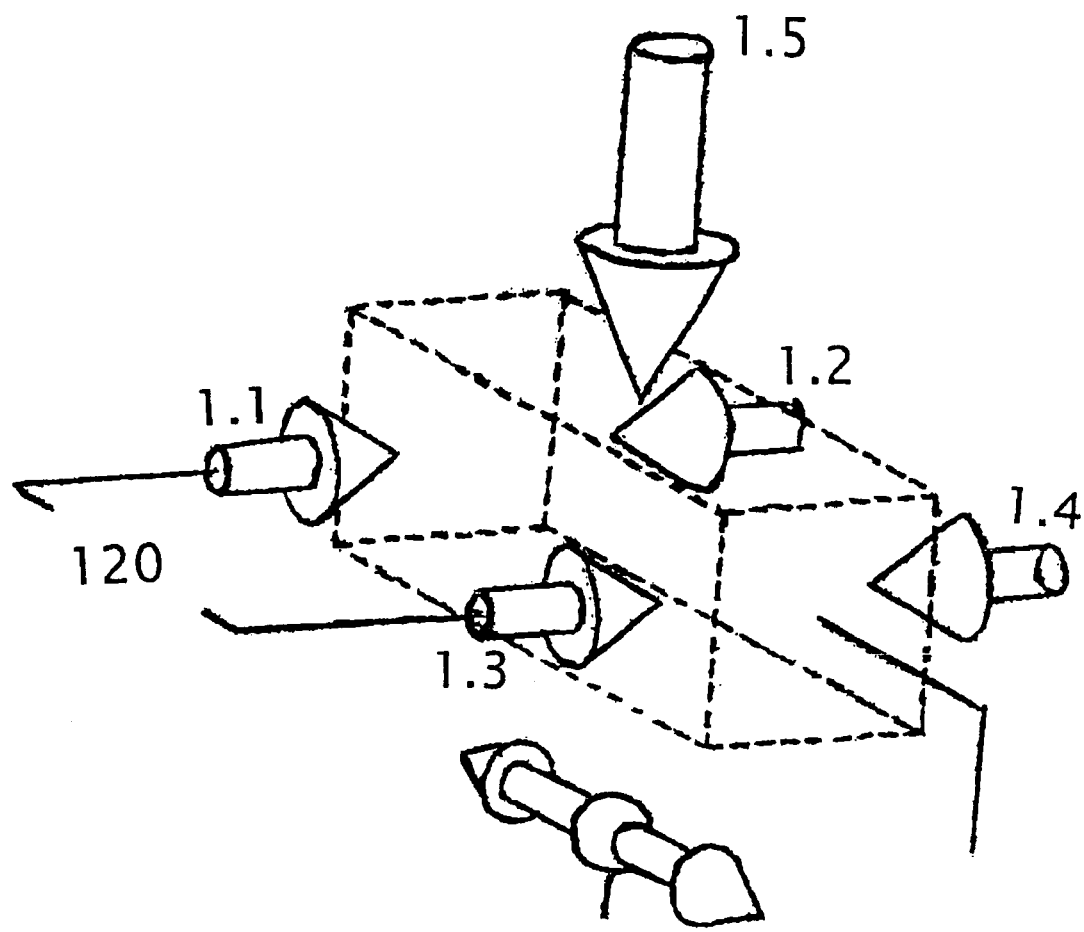
FIG. 3 shows the schematic configuration of one of the two drive units with which parallel displacements in the direction of the X and/or Z coordinates, and rotations about the X, Y, and/or Z directions, can selectably be achieved.

Each drive unit 1, 2 is equipped with a total of five electromagnetic actuators 1.1, 1.2, 1.3, 1.4, 1.5 and 2.1, 2.2, 2.3, 2.4, 2.5, of which four in each case (actuators 1.1, 1.2, 1.3, 1.4 and 2.1, 2.2, 2.3, 2.4) serve to implement adjustment motions in the Z direction, and one in each case (actuators 1.5 and 2.5) to implement adjustment motions in the Y direction. FIG. 3 depicts the arrangement of actuators 1.1, 1.2, 1.3, 1.4, and 1.5 in drive unit 1.

Each of these actuators 1.1, 1.2, 1.3, 1.4, 1.5 and 2.1, 2.2, 2.3, 2.4, 2.5 possesses its own "local" capacitative measurement system for highly accurate measurement of the air gap between stator and rotor, or between the working surface of the actuator and the guide surface on the stator, in a range of ±0.5 mm at a resolution of 20 nm. Motion in coordinates Y, Z, RY, and RX is made possible by influencing the width of the air gap in controlled fashion.

Actuators 1.5 and 2.5 are in this case of hybrid design, i.e. they possess built-in permanent magnets that compensate without power dissipation for the predominant portion of the weight (approx. 50 kg) of the mass to be moved. If, in other embodiments of the invention, the Z coordinate rather than the Y coordinate should point in the direction of gravity, actuators 1.1, 1.2, 1.3, 1.4 and 2.1, 2.2, 2.3, 2.4 are designed accordingly.

Taking into consideration the geometric data of the arrangement as indicated in FIG. 3 and the resolution of the measurement systems of the individual "local" actuators 1.1, 1.2, 1.3, 1.4, 1.5 and 2.1, 2.2, 2.3, 2.4, 2.5, the following (theoretical) displacement ranges and positional resolutions are obtained in the individual coordinates: X±160 mm (5 mn); Y±160 mm as total displacement range and ±0.5 mm as parallel shift (20 nm); Z±0.5 mm (5 nm); RX±0.4 mrad (16 nrad); RY±4 mrad (160 nrad); RZ±5 mrad (6 nrad).

Figure 4:
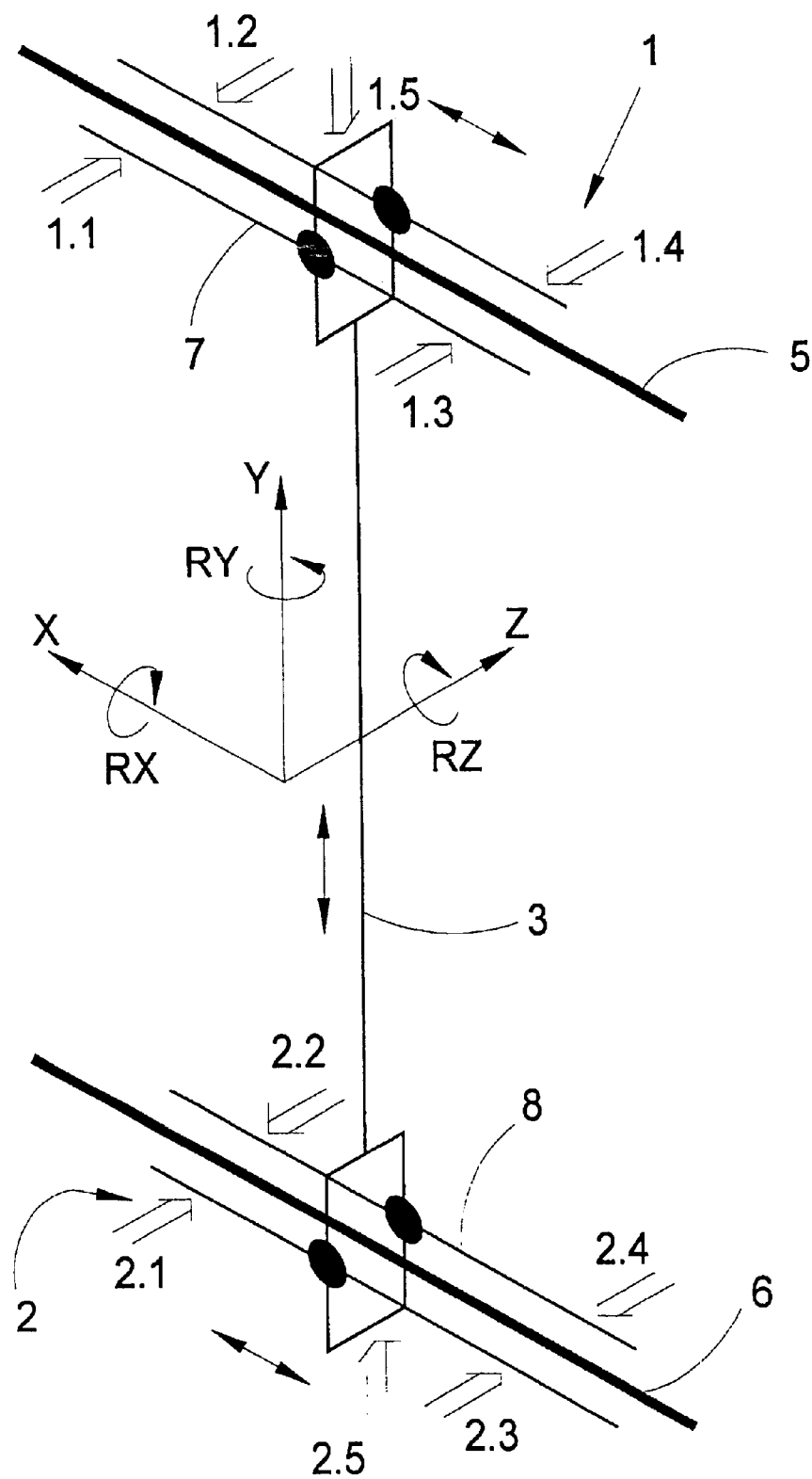
FIG. 4 shows a diagram explaining the adjustment motions in the X, Y, Z, RX, RY, RZ degrees of freedom.

The manner in which the adjustment motions are achieved in the degrees of freedom X, Y, Z, RX, RY, and RZ will be explained once again with reference to FIG. 4. The symbolically depicted linear guidance system 3; drive unit 1 having stator 5, rotor 7, and actuators 1.1, 1.2, 1.3, 1.4, 1.5; and drive unit 2 having stator 6, rotor 8, and actuators 2.1, 2.2, 2.3, 2.4, 2.5, are evident. Actuators 1.1, 1.2, 1.3, 1.4 are provided to modify the width measured in direction Z of the air gap between stator 5 and rotor 7 on drive unit 1, and actuators 2.1, 2.2, 2.3, 2.4 to modify the width measured in direction Z of the air gap between stator 6 and rotor 8 on drive unit 2. Actuator 1.5 on drive unit 1 and actuator 2.5 on drive unit 2 serve to modify the width of the air gap measured in direction Y.

The adjustment motions are implemented as follows:

Parallel displacement in coordinate X in one or the other direction by synchronous activation of the linear motors (rotor 7 in drive unit 1 and rotor 8 in drive unit 2);

Parallel displacement in coordinate Y in one or the other direction by synchronous activation of actuators 1.5 and 2.5;

Parallel displacement in coordinate Z in one or the other direction by synchronous activation of actuator pairs 1.1/1.2 and 1.3/1.4 and actuator pairs 2.1/2.2 and 2.3/2.4;

Rotation RX about coordinate X by activation of actuator pairs 1.1/1.2 and 1.3/1.4 asynchronously with activation of actuator pairs 2.1/2.2 and 2.3/2.4 (and thus modification in opposite directions of the air gaps on the linear motors);

Rotation RY about coordinate Y by activation of actuator pairs 1.1/1.2 and 2.1/2.2 asynchronously with activation of actuator pairs 1.3/1.4 and 2.3/2.4 (and thus modification in opposite directions of the air gaps within the two linear motors);

Rotation RZ about coordinate Z by activation of the linear motor in drive units 1 asynchronously with activation of the linear motor in drive units 2.

The arrangement selected has the following advantages: A self-contained unit can be moved with high precision in all six spatial degrees of freedom. It is magnetically guided and "floats" in three dimensions in almost noncontact fashion (aside from electrical supply lines and the influence of the Bowden cable), i.e. is largely free of friction and wear. The drives, representing potential interference field sources, are comparatively far away (more than half a meter) from the exposure location. The field proceeding from the drives can be further drastically reduced by suitable (in the present case, triple) shielding.

A further region around the ion beam used for exposure is iron-free, thereby minimizing distortion of the exposure. As a result of the permanent-magnet-based weight compensation in the magnetic guidance system, the electromagnetic actuators of the guidance system can be operated with almost zero static current, resulting in low power conversion and thus little heating of the drives in vacuum. The coils in the direct drives for rapid and accurate horizontal positioning are statically mounted and therefore easy to cool.

Large working air gaps in the magnetic guidance system are needed in order to ensure a sufficient movement range in the rotation axes, in particular RX. This results in lower resolution for the rotation axes with a smaller base spacing, in this case RY.

Advantageously, drive units 1, 2 are each located in a housing made of steel. This steel housing is at the same time the first layer of the magnetic shielding; two further layers of mu metal are applied once drive units 1, 2 are completely installed and aligned. Each shield is equipped with a labyrinth seal for the magnetic interference field proceeding from drive units 1, 2 through which motion passes outward. Experiments in a shielding chamber have shown that with the three-layer shielding, it is possible to reduce the magnetic field proceeding from a drive to 10 nT (static) and 5 pT (dynamic) at the exposure location.

The problem of outgassing and heating of the drive elements was also investigated. Aluminum foil equipped on all sides with an oxide coating is used as the coil material. The coil cores, also equipped with an oxide coating, largely prevent the formation of eddy currents and thus result in less heating and a short time constant for the coils. The heat created in the coils of the electrodynamic direct drives is dissipated at the ends of the coil cores through copper blocks having channels for a cooling fluid. These additionally impart a stable T-shape to the stator of the direct drive.

A different approach was used for the electromagnets and their coils that are present in the actuators of the direct drives. To minimize the number of supply lines to the moving part, cooling lines were dispensed with here. The electromagnets were instead optimized for a low current/force ratio and a high force/mass ratio. As a result, the electromagnets of the Z guidance system achieve, at a force of 100 N and a 1-mm air gap, a power dissipation of only 3 W at a weight of 0.6 kg each, while the figures for the Y electromagnets—more heavily loaded because their weight compensation is not quite complete—are 1.4 kg and 1.3 W at 100 N and a 1-mm air gap. The aforesaid forces are needed, however, only with strong accelerations and usually at smaller air gaps (approx. 0.5 mm). Since the electromagnets are operated with almost zero static current (aside from small forces that must always be applied to compensate for torques and residual weight), the average power consumption is considerably lower, being in total approximately 0.5 W in the entire magnetic guidance system of a direct drive. The overtemperature in the immediate vicinity of the electromagnet coils that can be estimated therefrom is 3 K, decreasing to <1 K in the immediate vicinity of the coils. Since both the actuator and the stator in the direct drive are equipped with a black aluminum oxide coating, the power consumed in the guidance systems is at least partially emitted as thermal radiation to the cooled stator.

In summary, this example of a positioning system describes a magnetically guided, electromagnetically driven, high-precision vertical wafer stage that emits very low magnetic interference fields and is suitable for use in high vacuum. With this stage, despite a difficult system environment, positioning smoothness and accuracy values in the sub-micrometer or -$\mu$rad range, and moreover particularly good synchronization of the wafer stage, are achieved.

| PARTS LIST |
| --- |
| 1 Drive unit |
| 1.1, 1.2, 1.3, 1.4, 1.5 Actuators |
| 2 Drive unit |
| 2.1, 2.2, 2.3, 2.4, 2.5 Actuators |
| 3 Linear guidance system |
| 4 Retention system |
| 5, 6 Stators |
| 7, 8 Rotors |
| 9, 10 Plane mirror interferometers |
| 11 Shielding walls |
| 12 Wafer chuck |
| 13 Stepping motor drive |
| X, Y, Z Coordinates |
| RX, RY, RZ Rotation axes |

What is claimed is:

1. An arrangement for positioning substrates, in particular for positioning wafers, within a device for exposure or measurement by means of radiation under high-vacuum conditions, comprising a retention system (4), displaceable on a linear guidance system (3), for receiving the substrate, the guidance direction of the linear guidance system (3) being oriented parallel or substantially parallel to the Y coordinate of an X, Y, Z spatial coordinate system;

drives for limited modification of the inclination of the guidance direction relative to the Y coordinate;

drives for limited rotation of the linear guidance system (3), including the retention system (4), about the guidance direction;

drives for parallel displacement of the linear guidance system (3), including the retention system (4), in the direction of the X coordinate, the Y coordinate, and/or the Z coordinate and two drive units (1, 2), each of which comprises a linear motor having a modifiable air gap between a stator (5, 6) and a rotor (7, 8).

2. The arrangement as defined in claim 1, wherein for generation of the change in inclination, rotation, and/or parallel displacement in the direction of the X and Z coordinates the two drive units (1, 2) are provided, the rotors (7, 8) being displaceable in the X direction and each rotor (7, 8) being joined to an opposite end of the linear guidance system (3) so that a synchronous displacement of the two rotors (7, 8) causes a parallel displacement in the X direction, whereas an asynchronous displacement of the two rotors (7, 8) causes a change in inclination in the X direction; and a synchronous change in the air gaps in the two linear motors causes a parallel displacement in the Z direction or a rotation RY, whereas an asynchronous change in the air gaps in the two linear motors causes a change in inclination in the Z direction.

3. The arrangement as defined in claim 2, wherein in order to vary the air gap, each linear motor is equipped with four electromagnetic actuators (1.1, 1.2, 1.3, 1.4; 2.1, 2.2, 2.3, 2.4) that lie opposite each other in pairs at the respective stator (5, 6), the two actuator pairs (1.1/1.2 and 1.3/1.4; 2.1/2.2 and 2.3/2.4) having, for each linear motor, a spacing from one another measured in the X direction, and a parallel displacement in the Z direction being achieved by a synchronous actuation of the two actuator pairs (1.1/1.2 and 1.3/1.4; 2.1/2.2 and 2.3/2.4) on the two linear motors, and a rotation RX being achieved by synchronous actuation of one actuator pair (1.1/1.2 or 1.3/1.4; 2.1/2.2 or 2.3/2.4) on each of the two linear motors.

4. The arrangement as defined in claim 2, wherein frame-mounted subassemblies of the linear motors, in particular coils, are cooled and/or movable subassemblies of the linear motors, in particular the rotors, are equipped with a thermally radiating surface coating.

5. The arrangement as defined in claim 1, wherein at least an electromagnetic actuator (1.5) is provided as the drive for parallel displacement of the linear guidance system (3) in the Y direction, activation of this actuator (1.5) resulting in a change in the air gap, measured in the Y direction, in the linear motors.

6. The arrangement as defined in claim 1, wherein the retention system (4) and the guideway of the linear guidance system (3) are made of nonmagnetic material; a stepping motor (13) is present whose rotational motion is converted, via a Bowden cable system, into the linear motion of the retention system (4) along the linear guidance system (3); and devices, in particular piezoactuators, are provided for clamping the retention system (4) in a defined displacement position on the linear guidance system (3).

7. The arrangement as defined in claim 1, wherein the retention system (4) substantially comprises a wafer chuck (12) made of Zerodur for placement and electrostatic retention of the substrates to be exposed or measured, and a frame fabricated of titanium for mounting the wafer chuck (12); and the linear guidance system (3) is fabricated of ceramic, the frame being coupled to the linear guidance system (3) via lubrication-free ceramic ball bearings.

8. The arrangement as defined in claim 1, wherein interferometer arrangements (9, 10, 14) that operate independently of one another are provided for measuring the respectively achieved displacement positions of the retention system (4) and/or of the rotors (7, 8) in the X and Y directions.

9. The arrangement as defined in claim 8, wherein mirror surfaces, which serve for measurement of the respectively achieved displacement positions using the interferometer arrangements (14) that are provided, are machined onto the retention system (4).

10. The arrangement as defined in claim 1, wherein three capacitative sensors that measure the distance of the substrate surface from a stipulated reference plane are provided for measurement of the position of the substrate in the Z direction.

11. The arrangement as defined in claim 1, wherein means are provided for magnetic shielding of the regions in which the radiation used for exposure and/or measurement travels, with respect to interfering magnetic fields and in particular with respect to magnetic fields of the drives for inclination change, rotation, and/or parallel displacement.

12. The arrangement as defined in claim 11, wherein multi-layer shielding walls (11) are present, the shielding walls (11) being offset laterally from one another between subassemblies that are displaceable with respect to one another so that meander-shaped magnetic seals are constituted.

* * * * *